(12) United States Patent
Beausoleil et al.

(10) Patent No.: US 7,904,288 B1
(45) Date of Patent: Mar. 8, 2011

(54) HARDWARE EMULATOR HAVING A VARIABLE INPUT EMULATION GROUP

(75) Inventors: William F. Beausoleil, Hopewell Junction, NY (US); Beshara G. Elmufdi, Sunnyvale, CA (US); Mitchell G. Poplack, San Jose, CA (US); Tai Su, Hyde Park, NY (US)

(73) Assignee: Cadence Design Systems, Inc., San Jose, CA (US)

(*) Notice: Subject to any disclaimer, the term of this patent is extended or adjusted under 35 U.S.C. 154(b) by 679 days.

(21) Appl. No.: 11/593,295

(22) Filed: Nov. 6, 2006

(51) Int. Cl.
G06F 9/455 (2006.01)

(52) U.S. Cl. .......... 703/23; 703/24; 703/25; 703/26; 703/27; 703/28; 716/1; 716/5; 712/11

(58) Field of Classification Search .......... 703/23–28; 716/1, 5; 712/11
See application file for complete search history.

(56) References Cited

U.S. PATENT DOCUMENTS

| | | | | |
|---|---|---|---|---|
| 4,707,784 A * | 11/1987 | Ryan et al. | .......... | 711/140 |
| 5,551,013 A * | 8/1996 | Beausoleil et al. | .......... | 703/23 |
| 5,712,806 A * | 1/1998 | Hennenhoefer et al. | .......... | 716/16 |
| 5,943,490 A * | 8/1999 | Sample | .......... | 703/28 |
| 6,051,030 A * | 4/2000 | Beausoleil et al. | .......... | 703/28 |
| 6,058,469 A * | 5/2000 | Baxter | .......... | 712/43 |
| 6,240,046 B1 * | 5/2001 | Proebsting | .......... | 365/233.17 |
| 6,570,404 B1 * | 5/2003 | Norman et al. | .......... | 326/39 |
| 6,618,698 B1 * | 9/2003 | Beausoleil et al. | .......... | 703/23 |
| 6,882,176 B1 * | 4/2005 | Norman et al. | .......... | 326/39 |
| 6,931,489 B2 * | 8/2005 | DeLano et al. | .......... | 711/122 |
| 7,043,417 B1 * | 5/2006 | Beausoleil et al. | .......... | 703/26 |
| 7,107,203 B1 * | 9/2006 | Beausoleil et al. | .......... | 703/28 |
| 7,155,708 B2 * | 12/2006 | Hammes et al. | .......... | 717/155 |
| 7,353,488 B1 * | 4/2008 | Coffin et al. | .......... | 716/18 |
| 7,444,276 B2 * | 10/2008 | Watt et al. | .......... | 703/15 |
| 7,555,423 B2 * | 6/2009 | Beausoleil et al. | .......... | 703/23 |
| 7,606,698 B1 * | 10/2009 | Elmufdi et al. | .......... | 703/25 |
| 7,725,304 B1 * | 5/2010 | Beausoleil et al. | .......... | 703/23 |
| 7,739,093 B2 * | 6/2010 | Beausoleil et al. | .......... | 703/14 |
| 2001/0020224 A1 * | 9/2001 | Tomita | .......... | 703/23 |
| 2002/0072889 A1 * | 6/2002 | Hoffman et al. | .......... | 703/14 |
| 2004/0123258 A1 * | 6/2004 | Butts | .......... | 716/5 |
| 2005/0267732 A1 * | 12/2005 | Beausoleil et al. | .......... | 703/28 |
| 2006/0190237 A1 * | 8/2006 | Beausoleil et al. | .......... | 703/23 |
| 2007/0073999 A1 * | 3/2007 | Verheyen et al. | .......... | 712/11 |
| 2007/0198809 A1 * | 8/2007 | Beausoleil et al. | .......... | 712/11 |

OTHER PUBLICATIONS

J. Babb, R. Tessier, M. Dahl, S. Z. Hanono, D. M. Hoki, and A. Agarwal, "Logic Emulation with Virtual Wires" vol. 16, No. 6, IEEE Jun. 1997.*

* cited by examiner

*Primary Examiner* — Kamini S Shah
*Assistant Examiner* — Kibrom Gebresilassie
(74) *Attorney, Agent, or Firm* — Moser IP Law Group

(57) ABSTRACT

A hardware emulator having a variable input emulation group is described. Each emulation group comprises two or more processors, where one of the processors (a first processor) is coupled to a data input selector and another one of the processors (a second processor) processes a first amount of data received from a data array. The data input selector receives the first amount of data and a second amount of data from the data array, and selects a third amount of data from among the first and second amounts of data. The third amount of data is provided to the first processor for evaluation.

16 Claims, 6 Drawing Sheets

HARDWARE EMULATOR HAVING A VARIABLE INPUT EMULATION GROUP

BACKGROUND OF THE INVENTION

1. Field of the Invention

Embodiments of the present invention generally relate to a hardware emulator and, more specifically, a hardware emulator having variable input primitives.

2. Description of the Related Art

Hardware emulators are programmable devices used in the verification of hardware designs. A common method of hardware design verification uses processor-based hardware emulators to emulate the design. These processor-based emulators sequentially evaluate combinatorial logic levels, starting at the inputs and proceeding to the outputs. Each pass through the entire set of logic levels is known as a cycle; the evaluation of each individual logic level is known as an emulation step.

A hardware emulator generally comprises a computer workstation for providing emulation support facilities, i.e., emulation software, a compiler, and a graphical user interface to allow a person to program the emulator, and an emulation engine for performing the emulation. The emulation engine is comprised of at least one emulation board, and each emulation board contains individual emulation circuits. Each individual emulation circuit contains multiple emulation processors, and each emulation processor is capable of mimicking a logic gate. Thus, the hierarchy of the emulation engine is an emulation board, multiple emulation integrated circuits, and multiple processors that are part of each emulation integrated circuit.

Each processor is connected to a data array. The data array is a special memory that has multiple read ports and supplies input data to the processor via each read port. The processor evaluates the data supplied from the data array in accordance with an instruction word supplied from an instruction memory. The computational efficiency of the hardware emulator is governed by the amount of data a processor can evaluate in a single emulation step. The processor does not always evaluate all of the input data from all of the read ports of the data array. For example, if a data array has four read ports, and a processor is evaluating a function that requires two operands, input data supplied from two out of the four read ports of the data array will be unused by the processor.

The computational efficiency of the hardware emulator can be increased if a greater amount of data supplied from the data array is evaluated in a single emulation step. Further efficiencies can be achieved if a variable amount of data could be processed.

Thus, there is a need in the art for a method and apparatus that enables a hardware emulator to evaluate a variable amount of data in a single emulation step.

SUMMARY OF THE INVENTION

A method and apparatus for evaluating a variable amount of data using an emulation group in a hardware emulator is described. Each emulation group comprises two or more processors, e.g., at least a first processor and a second processor. The second processor is coupled to a data input selector. The first processor processes a first amount of data received from a data array. The data input selector receives the first amount of data and a second amount of data from the data array, and selects a third amount of data from the first and second amounts of data. The third amount of data is provided to the second processor for evaluation. The present invention allows a variable number of input signals to be evaluated by each processor with an emulation group.

In one embodiment of the invention, the first processor and second processor each evaluate four input signals. In another embodiment of the invention, the first processor evaluates five input signals and the second processor evaluates three input signals. Further, emulation pairs may be combined to evaluate a greater number of input signals than is possible by a single emulation pair within an emulation step. The method comprises providing a first amount of data from a data array to a first processor and providing the first amount of data and a second amount of data from the data array to a data input selector. The data input selector selects a third amount of data and provides the third amount of data to a second processor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention is a hardware emulator having an emulation pair capable of evaluating variable input data. Each emulation pair includes two processors and a complementary multiplexer associated with each processor. Each processor is capable of evaluating a fixed number of data input signals, e.g., for data input signals, and the complementary multiplexers enable the emulation pair to perform an additional data input signal evaluation during an emulation step.

Figure 1:
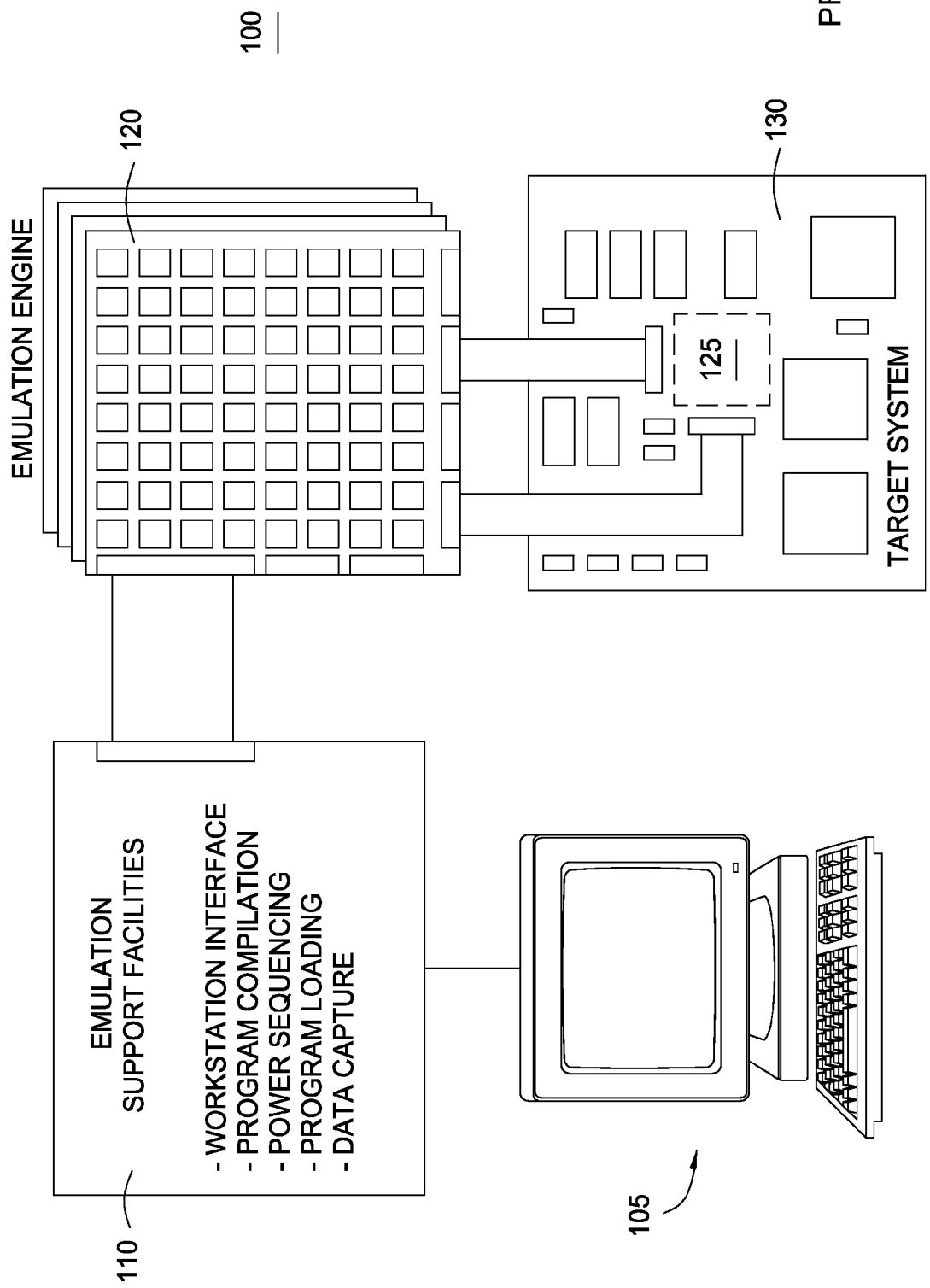
FIG. 1 is an overview of a hardware emulation system.

FIG. 1 is an overview of an emulation system 100 comprising a computer workstation 105, emulation support facilities 110, an emulation engine 120 and a target system 130. The computer workstation 105 is coupled to the emulation support facilities 110. The computer workstation 105 allows a user to interface with the emulation engine 120, control the emulation process and collect emulation results for analysis. The emulation support facilities 110 provide a workstation interface, program compilation, power sequencing, program loading and data capture. Under control of the computer workstation 105, programming information and data is loaded to the emulation engine 120 from the support facilities 110.

In response to the programming received from the emulation support facilities 110, the emulation engine 120 emulates a portion 125 of the target system 130. The portion 125 of the target system 130 may be an integrated circuit, a memory, a processor, or any object or device that can be emulated in a programming language. Popular emulation programming languages include Verilog and VHDL.

Figure 2:
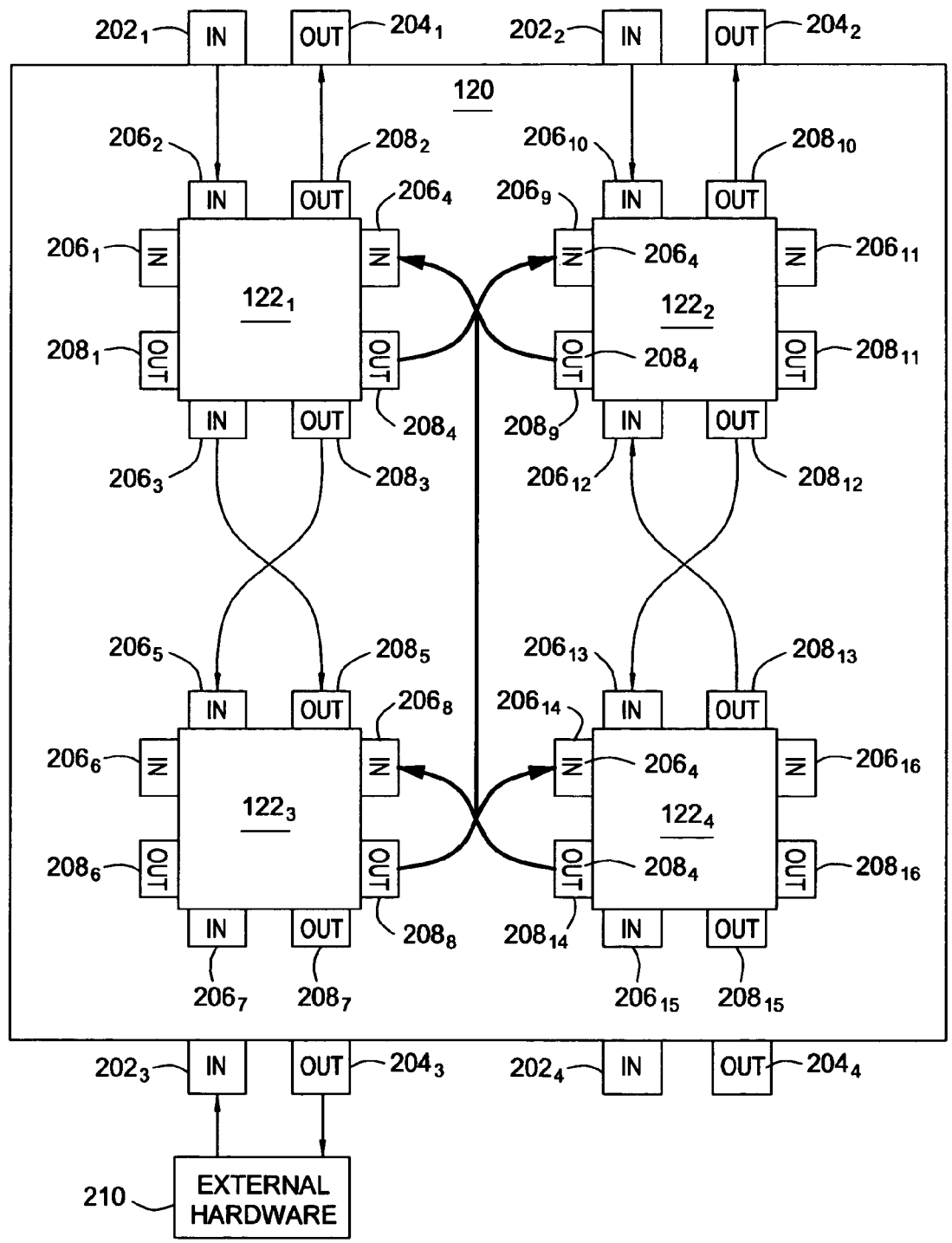
FIG. 2 is a functional block diagram of an emulation engine.

FIG. 2 is a block diagram of an emulation board 120. The emulation board 120 is comprised of individual emulation circuit groups $122_1$ to $122_4$ (collectively 122). The emulation board 120 has board inputs $202_1$ to $202_4$ (collectively 202) and board outputs $204_1$ to $204_4$ (collectively 204). The board inputs 202 and outputs 204 allow the emulation board 120 to connect to other emulation boards (not shown) and to external hardware 210. The external hardware 210 may be a VLSI circuit, a debugger, a memory, or any combination of hardware and software from which the emulation circuit group 122 can benefit.

Each emulation circuit group 122 has multiple inputs $206_n$ and multiple outputs $208_n$ (where n is an integer). The outputs 208 of each emulation circuit group 122 connect directly to the inputs 206 of the other emulation circuit groups 122 present on the emulation board 120.

Figure 3:
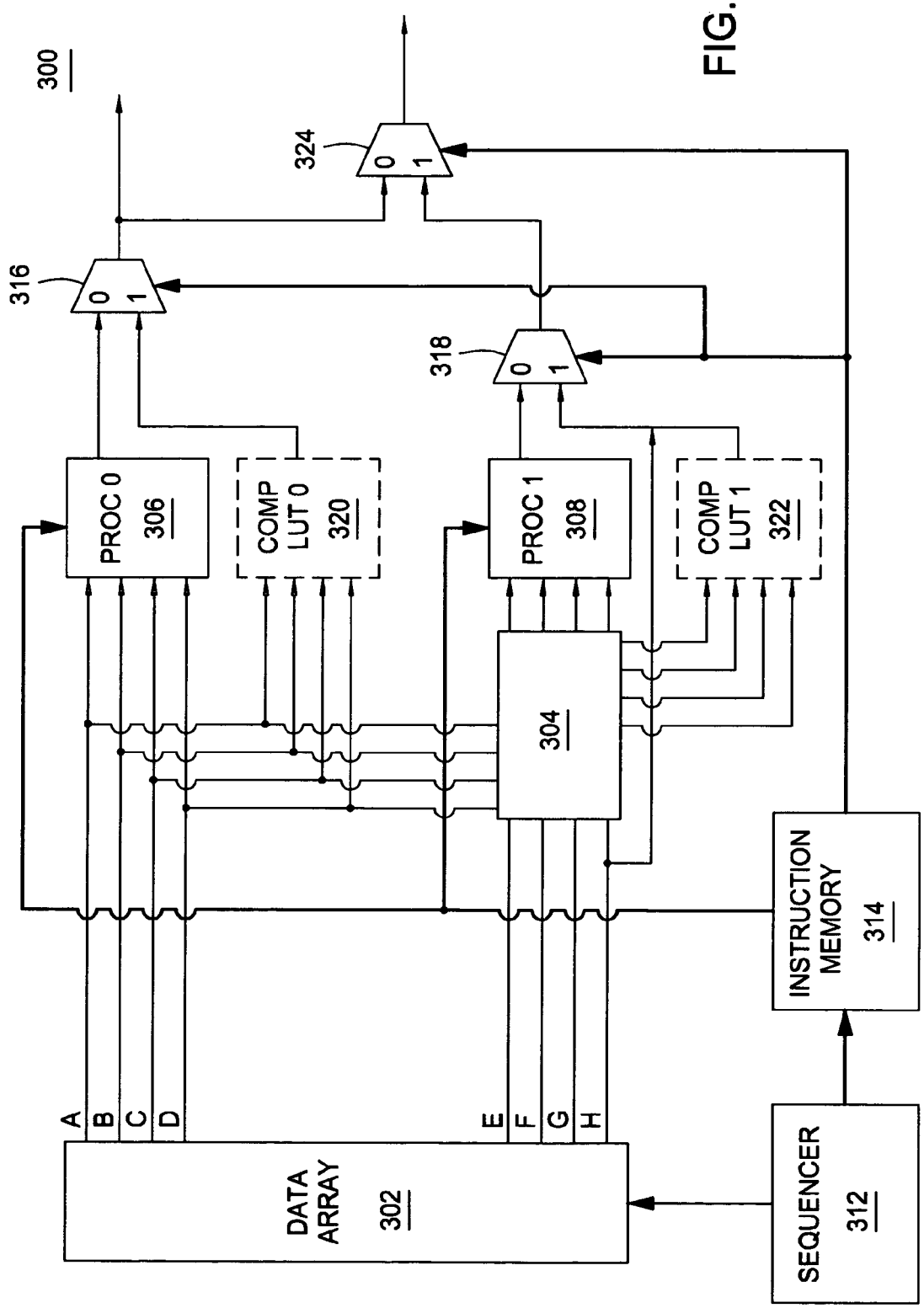
FIG. 3 is a block diagram of an emulation pair.

FIG. 3 is a block diagram of an emulation pair 300. The emulation pair 300 comprises a data array 302, a first processor 306 and a second processor 308, complementary multiplexers 320 and 322, output selection multiplexers 316/318/324, a signal input selector 304, a sequencer 312, and an instruction memory 314. For simplicity, only one emulation pair 300 is shown. Several emulation pairs may be grouped together in a cluster of processors to enable the cluster of processors to efficiently evaluate a large amount of input data in a single emulation step. In any such system, a single sequencer and instruction memory may be coupled to a plurality (or all) of the processors. The emulation pair 300 is the basic building block for creating this cluster of processors, and the invention is not limited to the emulation pair 300 comprising two processors 306 and 308. Additional processors may be used to form an M-ary group; however, the number is limited by the amount of processing that can occur within a cycle. For simplicity, the following disclosure describes the invention in the context of an emulation pair. However, those skilled in the art will understand that the same concepts apply to an emulation group of M-processors, where M is an integer greater than or equal to two.

The data array 302 is a memory that stores the output of the processors 306 and 308 as well as data from other processors. The write address for the data array 302 is provided by the sequencer 312. The data array 302 has n write ports, where n is equal to the number of processors 306 and 308. Each processor 306 and 308 is capable of accessing data stored in the data array 302 by another processor during one emulation cycle. For understanding, the data array is shown providing data input signals A, B, C, and D to processor 306, and data input signals A, B, C, D, E, F, G, and H to the signal input selector 304. The signal input selector determines which of the data input signals will be provided to processor 308. Thus, processor 308 is capable of accessing all of the data input signals A-H provided by the data array 302.

The processors 306 and 308 are fundamental components of the emulation engine 120. The processor's primary function is to execute an N-input logical function (where N is an integer) and produce a single bit result known as a function bit out. The processors 306 and 308 evaluate data received from the data array 302 using a control store word (CSW) supplied from the instruction memory 314 to produce an output bit, also known as a function bit out (FBO). The resulting function bit out may correspond to any one of: a logic gate output of the emulated design, a register output of the emulated design, a synthesized intermediate logic state, or a control bit generated for the emulation process.

The processor 306 receives a first amount of data from the data array 302. The first amount of data and a second amount of data are provided from the data array 302 to a data input selector 304. The data input selector 304 selects a third amount of data (a combination of the first and second amounts of data) to provide to the second processor 308. In one embodiment of the invention, the data input selector 304 is a multiplexer or a series of multiplexers, and the selection of the data input signals is performed by using an instruction word provided by the instruction memory. The processor 306 always receives the first amount of data from the data array 302. The signal input selector 304 only needs to select the data input signals for the processor 308, i.e., the second processor 308 is capable of receiving the first amount of data or the second amount of data, or any combination of the first and second amounts of data as the third amount of data. This provides an additional benefit of simplifying the design of the invention, and reducing the overall amount of total hardware needed to implement the invention.

The sequencer 312 supplies timing information to the emulation pair 300, provides read addresses to the instruction memory 314, and provides sequential write addresses to the data array 308. The sequencer 312 starts at an initial value and increments to a maximal value. Each increment of the sequencer 312 causes the step value to advance from zero towards the maximal value and is equivalent to an emulation step. Collectively, all of the emulation steps form one emulation cycle. An emulation cycle is complete once the sequencer 312 reaches its maximal value. Upon reaching its maximal value, the sequencer 312 begins counting again from its initial value and a new emulation cycle is initiated.

The instruction memory 314 stores instruction words, also referred to as control store words (CSWs). The instruction memory 314 is coupled to the sequencer 312, the processors 306 and 308, and the signal input selector 304. The instruction memory 314 receives read addresses from the sequencer 312 and provides instruction words to the processors 306 and 308. The instruction words control the operation of the processor 310.

The complementary multiplexers 320 and 322 are used by the emulation pair 300 to perform an additional look up table (LUT) operation during an emulation step. Each multiplexers specifically "complements" a specific processor, i.e., multiplexer 320 is complementary to processor 306, and multiplexer 322 is complementary to processor 308. The complementary multiplexers 320 and 322 receive the same data input signals as the processors they complement, for example, processor 306 receives the first amount of data and complementary multiplexer 320 receives an identical first amount of data.

There are several possible modes of operation utilized by the emulation pair 300. These modes of operation assume each processor 306 and 308 has four input ports for processing a maximum of four data input signals during an emulation step. The first mode is a "4/4 mode" of operation. In this mode, processor 306 and processor 308 each process four data input signals (e.g., A, B, C, D in processor 306 and E, F, G, H in processor 308) to produce two output bits, one output bit from each processor. The output bits produced by each processor 306 and 308 are stored to the data array 302.

The second mode is a "5/3 mode" of operation. The second mode of operation is referred to as a 5/3 mode of operation because processor 306 and its complementary multiplexer evaluate five data input signals, and processor 308 evaluates three data input signals. In this mode of operation, processor 306 processes four data input signals to produce an output bit and its complementary multiplexer 320 processes the same data input signals to produce an additional output bit. The output bit of the processor 306 and the output bit of the complementary multiplexer 320 are provided to an output selection multiplexer 316. The output multiplexer selects between the output bit of the processor 306 and the output bit of the complementary multiplexer 320. The selected output bit is stored to the data array 302. Processor 308 processes three data input signals (four data input signals are received by the processor 308, but one of the data input signals is ignored) to produce an output bit. The output bit produced by the processor 308 is stored to the data array 302.

In another embodiment of the invention, the complementary multiplexer 320 is a thirty-two (32) way multiplexer. This complementary multiplexer 320 is capable of evaluating five data input signals to produce an output bit in one emulation step. In this embodiment, the processor 306 still evaluates four data input signals as discussed above to produce an output bit. The output bit of the processor 306 and the output bit of the thirty-two way complementary multiplexer 320 are provided to an output selection multiplexer 316. In the first mode of operation, i.e., the 4/4 mode of operation, the output selection multiplexer 316 selects the output bit produced by the processor 306. In the second mode of operation, i.e., the 5/3 mode of operation, the output selection multiplexer 316 selects the output bit produced by the complementary multiplexer 320.

The third mode is a "6/0 mode" of operation. In the 6/0 mode of operation, processor 306 and its complementary multiplexer 320 operate together as in the 5/3 mode of operation. The processor 306 evaluates four data input signals (e.g., A, B, C, D) to produce an output bit, and the complementary multiplexer 320 produces an additional output bit. The output bit of the processor 306 and the output bit of the complementary multiplexer 320 are provided to an output selection multiplexer 316. The output selection multiplexer 316 selects between the output bit of the processor 306 and the output bit of the complementary multiplexer 320. Processor 308 evaluates data input signals (e.g., either A, B, C, D or E, F, G, H) to produce an additional output bit and the complementary multiplexer 322 produces an additional output bit. The output bit produced by the processor 308 and the output bit of the complementary multiplexer 322 are provided to an output multiplexer 318. The output selection multiplexer 318 selects between the output bit of the processor 308 and the output bit of the complementary multiplexer 322. The outputs of multiplexer 316 and the output of multiplexer 318 are provided to an output selection multiplexer 324. The output selection multiplexer 324 selects between the output bit of the multiplexer 316 and the output bit of the multiplexer 318, and writes the selected output to the data array.

For example, processors 306, 308, 320 and 322 may all operate upon data A, B, C, D, where processor 306 produces a bit representing F1 (A, B, C, D), processor 320 produces F2 (A, B, C, D), processor 308 produces F3 (A, B, C, D) and processor 322 produces F4 (A, B, C, D). F1, F2, F3 and F4 are four functions applied to the data inputs by each processor. Multiplexer 316 selects between F1 and F2, M1 (F1, F2); similarly, multiplexer 318 selects between F3 and F4, M2 (F3, F4). The multiplexer 324 selects between M1 and M2 to produce a value for the data array.

In another embodiment of the invention, the complementary multiplexer 320 is a sixty-four (64) way multiplexer. This complementary multiplexer 320 is capable of evaluating six data input signals to produce an output bit in one emulation step. In this embodiment, the processor 306 still evaluates four data input signals as discussed above to produce an output bit. The output bit of the processor 306 and the output bit of the sixty-four way complementary multiplexer 320 are provided to an output selection multiplexer 316. In the first mode of operation, i.e., the 4/4 mode of operation, the output selection multiplexer 316 selects the output bit produced by the processor 306. In the second mode of operation, i.e., the 6/0 mode of operation, the output selection multiplexer 316 selects the output bit produced by the complementary multiplexer 320.

The output selection multiplexers 316/318/324 are utilized by the emulation pair 300 to select a function bit out from the processors 306 and 308 and the complementary multiplexers 320 and 322. Output selection multiplexer 316 selects a function bit out from the output of processor 306 and complementary multiplexer 320. Output selection multiplexer 318 selects a function bit out from the output of processor 308 and complementary multiplexer 322. Output selection multiplexer 324 selects a function bit out from the output bit produced by output selection multiplexer 316 and the output bit produced by output selection multiplexer 318.

The emulation pair 300 may be combined with other emulation pairs to produce additional modes of operation. For example, two emulation pairs operating in a "6/0" mode of operation can provide their function bit outs to a multiplexer to evaluate seven data input signals in a single emulation step. Four emulation pairs operating in a "6/0" mode of operation can provide their function bit outs to a series of multiplexers to evaluate eight data input signals in a single emulation step. The emulation pair 300 is a basic building block for creating a primitive capable of evaluating a variable number of data input signals in a single emulation step.

Figure 4:
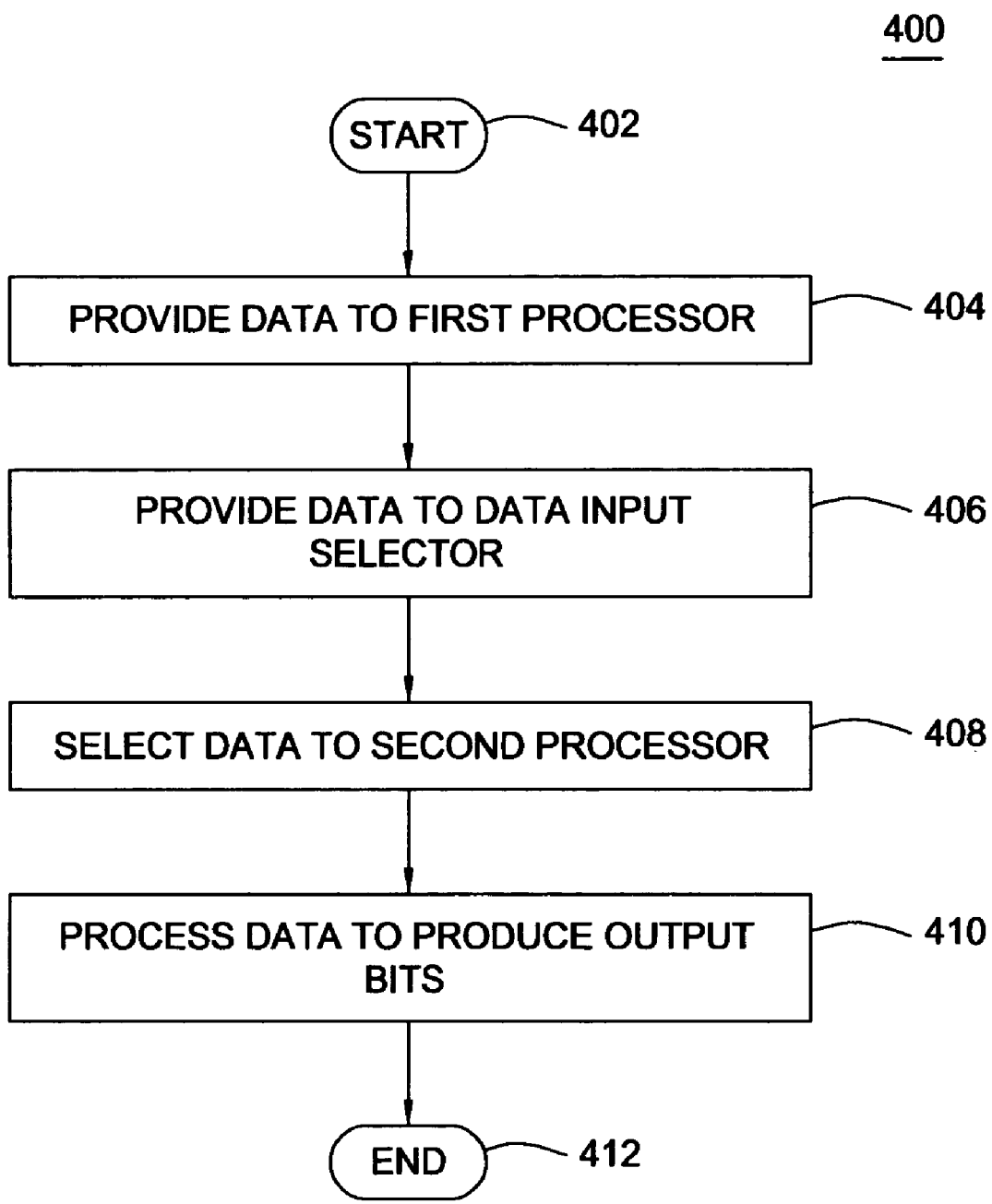
FIG. 4 is a flow diagram of a method that utilizes a first mode (4/4 mode) of operation by an emulation pair.

FIG. 4 is a flow diagram of a method 400 that utilizes a first mode (4/4 mode) of operation by an emulation pair 300. In the first mode of operation (4/4 mode), each processor 306 and 308 processes the same amount of data. In one embodiment of the invention, both processors 306 and 308 process four data input signals, hence the first operation is known as a "4/4 mode of operation". The method 400 starts at block 402 and proceeds to block 404. At block 404, a first amount of data is provided to a first processor 306 from a data array 302. At block 406, the first amount of data and a second amount of data from the data array 302 are provided to a data input selector 304. In one embodiment of the invention, the data input selector 304 is a multiplexer or a series of multiplexers. At block 408, the data input selector selects a third amount of data from the first and second amounts of data and provides the third amount of data to a second processor 308. At block 410, the first processor 306 and the second processor 308 process the data to produce output bits. The output bits produced by the processor 306 and 308 may be written back to the data array 302, or provided to another emulation pair for further processing.

Figure 5:
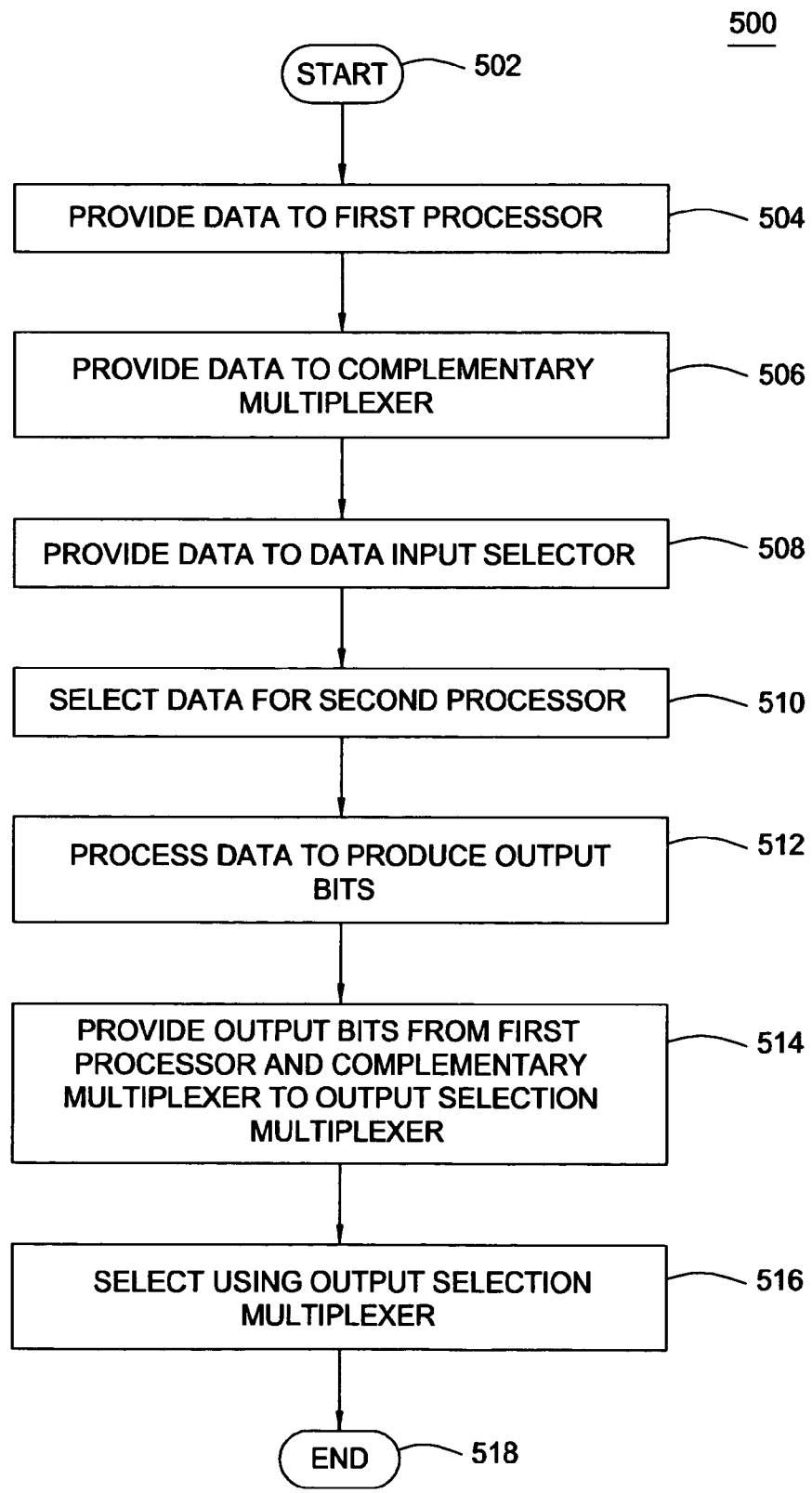
FIG. 5 is a flow diagram of a method that utilizes a second mode (5/3 mode) of operation by an emulation pair.

FIG. 5 is a flow diagram of a method 500 that utilizes a second mode (5/3 mode of operation). During the second mode of operation, a first processor 306 and a complementary multiplexer 320 process five data input signals, while a second processor 308 only processes three data input signals. Hence, the second mode of operation is known as a "5/3 mode of operation". The method 500 starts at block 502 and proceeds to block 504. At block 504, a first amount of data is provided to a first processor 306 from a data array 302. At block 506, the first amount of data is also provided to a complementary multiplexer 320. At block 508, the first amount of data and a second amount of data from the data array 302 are provided to a data input selector 304. At block 510, the data input selector 304 selects a third amount of data from the first and second amounts of data and provides the third amount of data to a second processor 308.

At block 512, the first processor 306 and the complementary multiplexer 320 process the first amount of data, and the second processor 308 processes the third amount of data to produce output bits. At block 514, the output bit produced by the first processor 306 and the output bit produced by the second processor 308 are provided to an output selection multiplexer 316. At block 516, the output selection multiplexer 316 selects between the output bit produced by the first processor 306 and the output bit produced by the complementary multiplexer 320 to produce a function bit out. The function bit out produced by the complementary multiplexer 320 is the evaluation of five data input signals, and the output bit of the second processor 308 is the evaluation of three data input signals. The function bit out and the output bit of the second processor 308 may be written back to the data array 302 or provided to another emulation pair for further processing. The method 500 ends at block 518.

Figure 6:
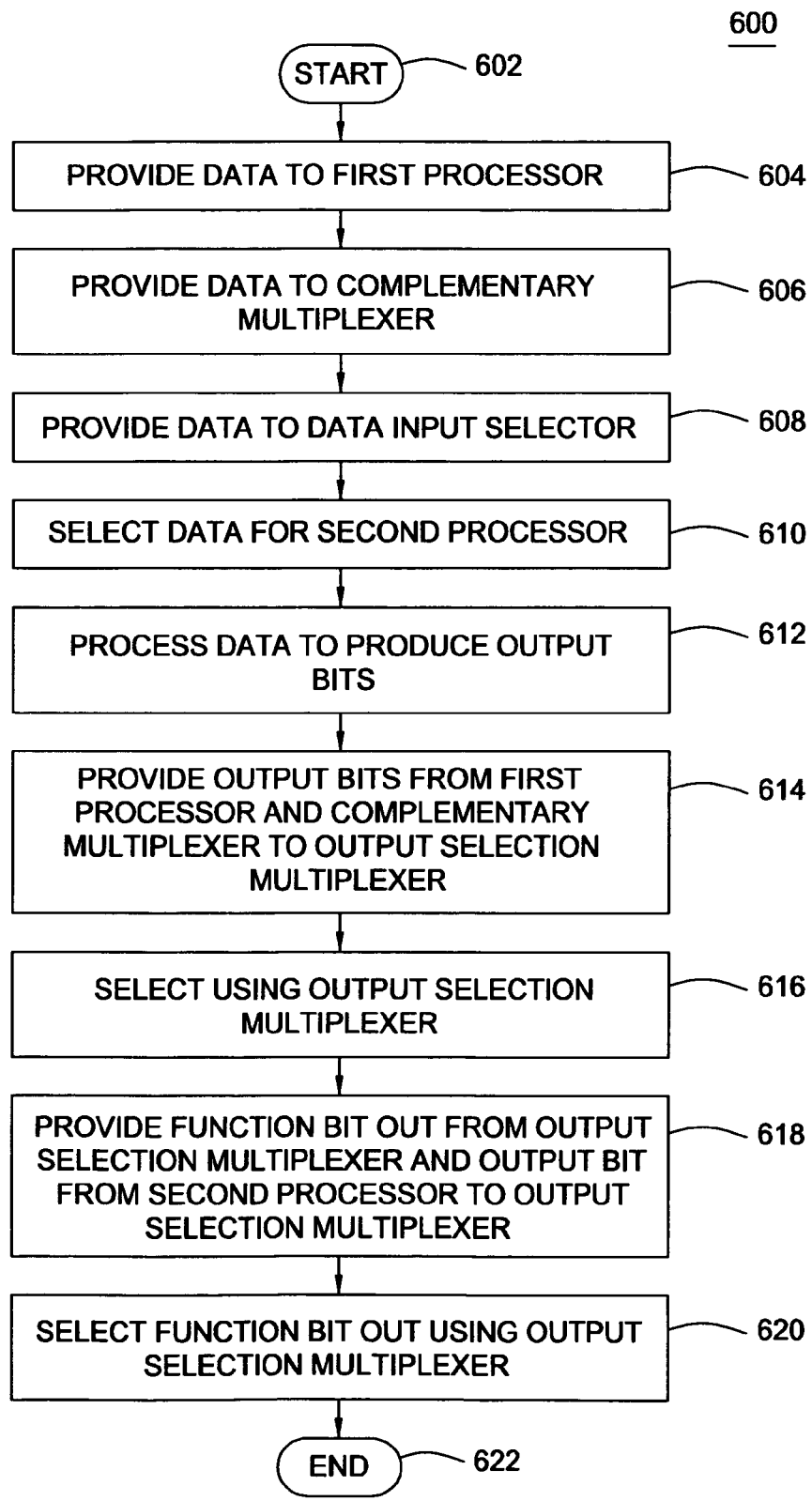
FIG. 6 is a flow diagram of a method 600 that utilizes a third mode (6/0 mode) of operation by an emulation pair.

FIG. 6 is a flow diagram of a method 600 that utilizes a third mode (6/0) mode of operation. In the third mode of operation, an emulation pair 300 processes six data input signals. A first processor 306 and a complementary multiplexer 320 function as in the second mode of operation to evaluate five data input signals. A second processor 308 and a complementary multiplexer 322 function to evaluate the sixth data input signal.

The method 600 begins at block 602 and proceeds to block 604. At block 604, a first amount of data is provided to a first processor 306 from a data array 302. At block 606, the first amount of data is also provided to a complementary multiplexer 320. At block 608, the first amount of data and a second amount of data from the data array 302 are provided to a data input selector 304. At block 610, the data input selector 304 selects a third amount of data from the first and second amounts of data and provides the third amount of data to a second processor 308.

At block 612, the first processor 306 and the complementary multiplexer 320 process the first amount of data, and the second processor 308 and the complementary multiplexer 322 process the second amount of data to produce output bits. At block 614, the output bit produced by the first processor 306 and the complementary multiplexer 320 are provided to an output selection multiplexer 316. At block 616, the output selection multiplexer 316 selects between the output bit produced by the first processor 306 and the output bit produced by the complementary multiplexer 320 to produce a function bit out. At block 618, the output bit produced by the first processor 308 and the complementary multiplexer 322 are provided to an output selection multiplexer 318. At block 620, the output selection multiplexer 318 selects between the output bit produced by the second processor 308 and the output bit produced by the complementary multiplexer 322 and produces another function bit out. At block 622, the output bit produced by the output selection multiplexer 316 and the output selection multiplexer 318 are provided to an output selection multiplexer 324. At block 624, the output selection multiplexer 324 selects between the function bit out produced by the output selection multiplexer 316 and function bit out produced by the output selection multiplexer 318 and produces another function bit out. The function bit out produced by the output selection multiplexer 324 is the evaluation of six data input signals by the emulation pair 300. The method ends at block 624.

The present invention provides the benefit of enabling an emulation pair to evaluate a variable number of data input signals in a single emulation step. The emulation pair includes two processors, and complementary multiplexers associated with each processor. The complementary multiplexers allow an additional lookup table function to be evaluated during an emulation step. A series of output selection multiplexers enable the emulation pair to select between the output of the processors and the complementary multiplexers. This enables the emulation pair to evaluate a variable number of data input signals. For example, the emulation pair may evaluate four, five, or six data input signals during a single emulation step. The present invention increases the computational efficiency of the hardware emulation system because a greater number of data input signals can be evaluated in a single emulation step. Further, the present invention provides flexibility. Emulation pairs can be combined to evaluate seven, eight, or more data input signals in a single emulation step.

While the foregoing is directed to embodiments of the present invention, other and further embodiments of the invention may be devised without departing from the basic scope thereof, and the scope thereof is determined by the claims that follow.

We claim:

1. A hardware emulator having an emulation group capable of evaluating a variable data input signal comprising:
    two or more processors, each processor capable of emulating a logic gate,
    a data input selector coupled to one of the two or more processors; and
    a data array for providing a first amount of data to a first processor and for providing the first amount of data and a second amount of data to the data input selector, wherein the data input selector selects a third amount of data from at least one of the first amount of data and the second amount of data, and supplies the third amount of data to a second processor;
    a complementary multiplexer for performing an additional lookup table operation during an emulation step; and
    an output selection multiplexer for selecting between the output of the first processor and the complementary multiplexer.

2. The hardware emulator of claim 1, wherein the first amount of data processed by the first processor is equal to the third amount of data processed by the second processor.

3. The hardware emulator of claim 1, wherein the first amount of data processed by the first processor is greater than the third amount of data processed by the second processor.

4. The hardware emulator of claim 1, further comprising an instruction memory for providing at least one instruction word to the first processor, the second processor, the data input selector, the complementary multiplexer and the output selection multiplexer.

5. The hardware emulator of claim 4, wherein the at least one instruction word is used to select the third amount of data from the data input selector.

6. The hardware emulator of claim 4, wherein the at least one instruction word is used to select the output of the output selection multiplexer.

7. The hardware emulator of claim 1 wherein the first amount of data and the third amount of data are evaluated in a single emulation step.

8. A method for providing a variable data input signal to an emulation group comprising:
    providing a first amount of data from a data array to a first processor;
    providing the first amount of data and a second amount of data from the data array to a data input selector;
    selecting, from the data input selector, a third amount of data from at least one of the first amount of data and the second amount of data; and
    providing the third amount of data to a second processor;
    wherein the first processor processes the first amount of data to produce an output bit, further comprising providing the first amount of data to a complementary multiplexer to produce an additional output bit.

9. The method of claim 8, further comprising providing an instruction word to the data input selector to select the third amount of data.

10. The method of claim 8 further comprising evaluating in a single emulation step the first amount of data and the third amount of data.

11. The method of claim 8, further comprising:
providing the output bit produced by the first processor and the additional output bit produced by the complementary multiplexer to an output selection multiplexer; and
selecting a function bit out from the output selection multiplexer.

12. The method of claim 11, wherein the second processor processes the third amount of data to produce an output bit, further comprising:
providing the output bit from the second processor to a second output selection multiplexer;
providing the function bit out from the output selection multiplexer to the second output selection multiplexer; and
selecting between the function bit out and the output bit from the second processor to produce a second function bit out.

13. An apparatus for providing a variable data input signal to an emulation group, comprising:
means for providing a first amount of data from a data array to a first processor;
means for providing the first amount of data and a second amount of data from the data array to a data input selector;
means for selecting, from the data input selector, a third amount of data from at least one of the first amount of data and the second amount of data; and
means for providing the third amount of data to a second processor;
means for instructing the first processor to process the first amount of data to produce an output bit, and
means for providing the first amount of data to a complementary multiplexer to produce an additional output bit.

14. The apparatus of claim 13, further comprising:
means for providing an instruction word to the data input selector to select the third amount of data.

15. The apparatus of claim 13, further comprising:
means for providing the output bit produced by the first processor and the additional output bit produced by the complementary multiplexer to an output selection multiplexer; and
means for selecting a function bit out from the output selection multiplexer.

16. The apparatus of claim 15, further comprising:
means for providing the output bit from the second processor to a second output selection multiplexer;
means for providing the function bit out from the output selection multiplexer to the second output selection multiplexer; and
means for selecting between the function bit out and the output bit from the second processor to produce a second function bit out.

* * * * *